(12) United States Patent
Ohta

(10) Patent No.: US 8,482,895 B2
(45) Date of Patent: Jul. 9, 2013

(54) ELECTRONIC CIRCUIT BOARD, MAGNETIC SENSOR, AND METHOD FOR PROTECTING POWER SUPPLY OF ELECTRONIC CIRCUIT

(75) Inventor: Naoki Ohta, Tokyo (JP)

(73) Assignee: TDK Corporation, Tokyo (JP)

( * ) Notice: Subject to any disclaimer, the term of this patent is extended or adjusted under 35 U.S.C. 154(b) by 248 days.

(21) Appl. No.: 13/019,601

(22) Filed: Feb. 2, 2011

(65) Prior Publication Data
US 2011/0194221 A1 Aug. 11, 2011

(30) Foreign Application Priority Data

Feb. 10, 2010 (JP) ................................ 2010-027926
Dec. 16, 2010 (JP) ................................ 2010-280373

(51) Int. Cl.
*H02H 5/04* (2006.01)

(52) U.S. Cl.
USPC ........................................................ 361/104

(58) Field of Classification Search
USPC ........................................................ 361/104
See application file for complete search history.

(56) References Cited

U.S. PATENT DOCUMENTS

| | | | |
|---|---|---|---|
| 6,538,861 | B1 | 3/2003 | Hayashi et al. |
| 7,649,770 | B2 * | 1/2010 | Bangert ........................ 365/173 |
| 8,264,233 | B2 * | 9/2012 | Wallash ........................ 324/452 |
| 2005/0141143 | A1 | 6/2005 | Ono et al. |
| 2008/0100411 | A1 * | 5/2008 | Tofigh et al. .................. 337/163 |
| 2008/0143382 | A1 * | 6/2008 | Bangert ........................... 326/41 |
| 2008/0203555 | A1 * | 8/2008 | Hsu et al. ...................... 257/693 |
| 2009/0324814 | A1 * | 12/2009 | Parkin ........................... 427/131 |
| 2011/0025339 | A1 * | 2/2011 | Wallash ........................ 324/457 |

FOREIGN PATENT DOCUMENTS

| | | |
|---|---|---|
| JP | 9-288805 | 11/1997 |
| JP | 11-89079 | 3/1999 |
| JP | 2002-303536 | 10/2002 |
| JP | 2006-134905 | 5/2006 |
| JP | 2008-96358 | 4/2008 |
| JP | 2008-118010 | 5/2008 |
| JP | 2008-202988 | 9/2008 |

OTHER PUBLICATIONS

Office Action issued Feb. 15, 2012, in Japanese Patent Application No. 2010-280373 (with English-language translation).
The European Search Report issued May 12, 2011, in Application No. 11 25 0144.0.
Steven Voldman, et al., "Electrostatic Discharge (ESD) Protection of Giant Magneto-resistive (GMR) Recording Heads With a Silicon Germanium Technology", Electrical Overstress/Electrostatic Discharge Symposium, XP031534174, Sep. 19, 2004, pp. 1-9.

* cited by examiner

*Primary Examiner* — Ronald W Leja
(74) *Attorney, Agent, or Firm* — Oblon, Spivak, McClelland, Maier & Neustadt, L.L.P.

(57) ABSTRACT

An electronic circuit board includes a TMR element having two terminals connected to a power supply and a ground, respectively, at least through a lead. After a breakdown of a tunnel barrier film of the TMR element, at least a part of the lead breaks by an overcurrent due to a short circuit between the two terminals.

7 Claims, 8 Drawing Sheets

ELECTRONIC CIRCUIT BOARD, MAGNETIC SENSOR, AND METHOD FOR PROTECTING POWER SUPPLY OF ELECTRONIC CIRCUIT

CROSS-REFERENCE TO RELATED APPLICATIONS

This application is based upon and claims the benefit of priority from prior Japanese Patent Application Nos. 2010-027926, filed Feb. 10, 2010 and 2010-280373, filed Dec. 16, 2010, the entire contents of each being incorporated herein by reference.

BACKGROUND OF THE INVENTION

1. Field of the Invention

The present invention relates to an electronic circuit board having a TMR element, a magnetic sensor using the same, and a method for protecting a power supply of an electronic circuit.

2. Description of the Related Art

Magnetic sensors having a magneto-resistive element such as TMR element or GMR element are used in various fields of industry, and in the automotive field, for example, they are used for detecting steering angle or speed.

As disclosed in Japanese Unexamined Patent Application Publication No. 2002-303536, such a magnetic sensor has a circuit configuration in which a magneto-resistive element is connected between a power supply (Vcc) and a ground (GND) (see FIG. 8). Here, when a GMR element or an AMR element is used as the magneto-resistive element, they allow an electric current to flow parallel to a film surface, so that even if a magnetic film is broken by a failure, an open circuit occurs only between the power supply and the ground and therefore the whole electronic circuit will never be fatally damaged by the failure.

When a TMR element is used as the magneto-resistive element, on the other hand, since it is constructed to have two magnetic layers opposed to each other across a tunnel barrier, a breakdown of the tunnel barrier due to a failure causes a short circuit, i.e., short between the power supply and the ground. Therefore, this failure may result not only in fatally damaging the whole circuit but also in causing fire, for example, at the power supply and leading to a dangerous situation such as fire disaster. Since the occurrence of such a situation may be fatal to humans, particularly, in the above-described automotive application, it is totally unacceptable.

From such a viewpoint, it has been increasingly demanded to realize a so-called fail-safe for the magnetic sensor using the TMR element. Moreover, since the above circuit configuration is widely applicable and not limited to the magnetic sensor, the fail-safe should be realized also in the field of other devices using the TMR element.

As a protecting circuit regarding the magneto-resistive element, for example, Japanese Unexamined Patent Application Publication No. 9-288805 discloses the one in which a diode is connected in parallel to a magneto-resistive element or a fuse is connected in series to a magneto-resistive element. However, this circuit is intended to protect the magneto-resistive element from an overcurrent but not to protect a power supply from the overcurrent. Accordingly, a short circuit accident which may be caused by a failure of the TMR element cannot be prevented by this circuit.

On the other hand, Japanese Unexamined Patent Application Publication No. 2008-202988 discloses a circuit which is to be controlled to stop operation upon detecting a change in an output signal of a magnetic field change detection element, thereby realizing a fail-safe in case of a failure of the magnetic field change detection element. With this method, however, it is difficult to effectively prevent an instantaneous overcurrent during the time from the failure detection to the stop control, and since a complicated control means is required, it is also disadvantageous for miniaturization and cost-reduction.

SUMMARY OF THE INVENTION

It is an object of the present invention to provide a small, low-cost electronic circuit board capable of effectively preventing a short circuit accident which may be caused by a failure of a TMR element, a magnetic sensor using the same, and a method for protecting a power supply of an electronic circuit including a TMR element.

In order to achieve the above object, an electronic circuit board according to the present invention comprises a TMR element having two terminals connected to a power supply and a ground, respectively, at least through a lead. Then, after a breakdown of a tunnel barrier film of the TMR element, at least a part of the lead breaks by an overcurrent due to a short circuit between the two terminals.

In the electronic circuit board according to the present invention, since the two terminals of the TMR element are connected between the power supply and the ground at least through the lead, if the tunnel barrier film is broken by a failure of the TMR element to cause a short circuit between the two terminals, the power supply and the ground can be short-circuited to generate an overcurrent.

In the electronic circuit board according to the present invention, therefore, at least a part of the lead is designed to break due to the overcurrent, thereby shutting off the overcurrent to protect the power supply. In addition, since the overcurrent can be shut off only by the break of the lead, a complicated control means is not required, making it easy to achieve miniaturization and cost-reduction of the electronic circuit board.

Thus, the electronic circuit board according to the present invention is capable of effectively preventing a short circuit accident which may be caused by a failure of the TMR element.

Moreover, a magnetic sensor according to the present invention comprises the foregoing electronic circuit board and is capable of detecting an external magnetic field with the TMR element. Thus, the magnetic sensor according to the present invention also has the same effect as above.

Furthermore, a power supply protecting method according to the present invention is a method for protecting a power supply of an electronic circuit including a TMR element having two terminals connected to a power supply and a ground, respectively, at least through a lead, comprising breaking at least a part of the lead with an overcurrent due to a short circuit between the two terminals due to a failure of the TMR element.

Thus, since the power supply protecting method according to the present invention has substantially the same feature as the foregoing electronic circuit board, it also has the same effect as above.

The other objects, constructions and advantages of the present invention will be further detailed below with reference to the attached drawings. However, the attached drawings show only illustrative examples.

DESCRIPTION OF THE PREFERRED EMBODIMENTS

Figure 1:
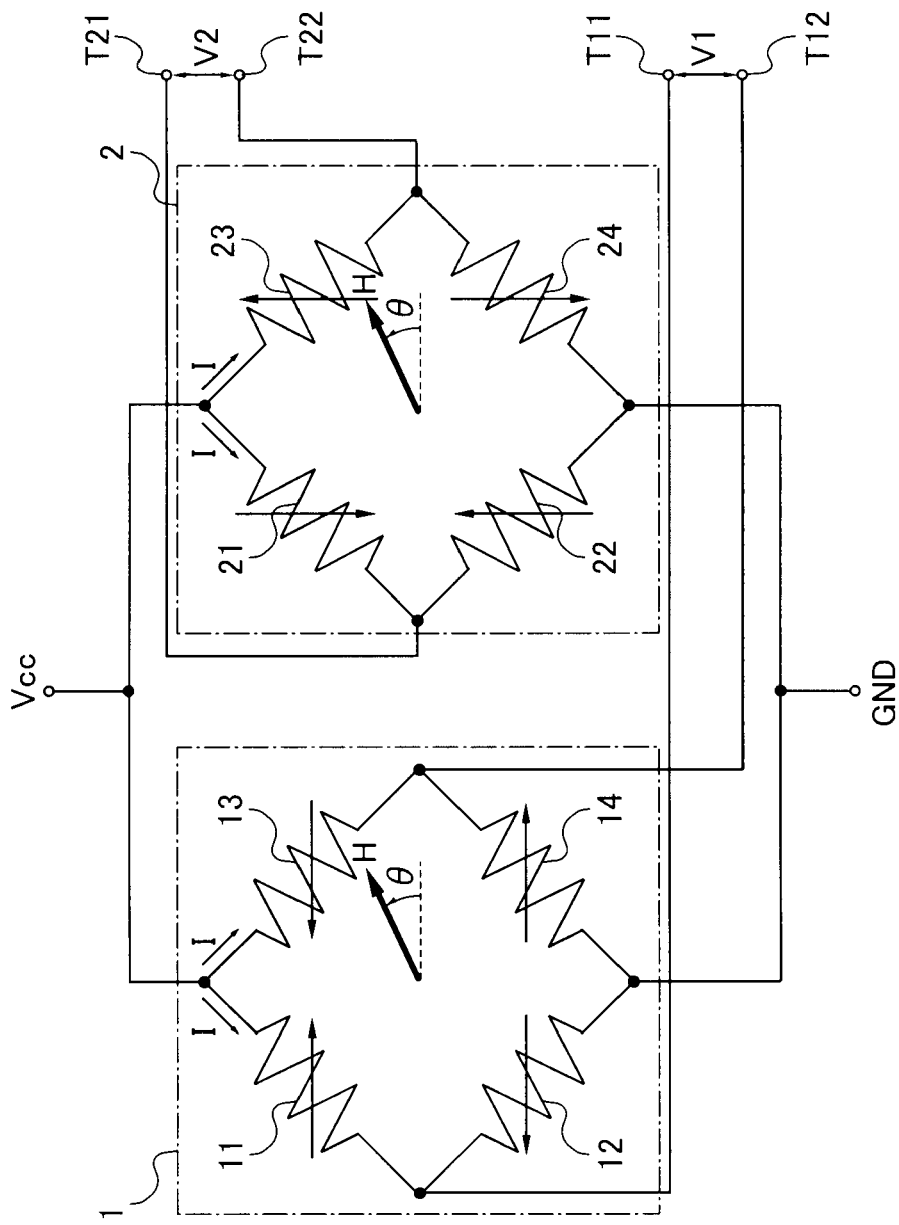
FIG. 1 is a circuit diagram of a magnetic sensor according to the present invention.

FIG. 1 is a circuit diagram of a magnetic sensor according to the present invention. The magnetic sensor circuit is to be used for a rotation angle sensor for detecting a rotation angle of a measurement target and includes first and second bridge circuits 1, 2 having first to fourth TMR elements 11 to 14, 21 to 24, respectively. It should be noted that the first to fourth TMR elements 11 to 14, 21 to 24 in this figure are each represented by a single TMR element but may be composed of a plurality of TMR elements.

In the first bridge circuit 1, the first and second TMR elements 11, 12 and the third and fourth TMR elements 13, 14 are respectively connected in series, and these series circuits are connected in parallel to each other. Then, the connected ends of the first and third TMR elements 11, 13 are connected to a power supply terminal Vcc, while the connected ends of the second and fourth TMR elements 12, 14 are connected to a grounding terminal (earth terminal) GND.

Furthermore, the connected ends of the first and second TMR elements 11, 12 are connected to a first output terminal T11, while the connected ends of the third and fourth TMR elements 13, 14 are connected to a second output terminal T12. The electric potential of the first output terminal T11 with respect to the second output terminal T12 can be detected as a first output voltage V1.

In the second bridge circuit 2, on the other hand, the first to fourth TMR elements 21 to 24 are connected in the same manner as in the first bridge circuit 1, wherein the electric potential of a first output terminal T21 with respect to a second output terminal T22 can be detected as a second output voltage V2.

Figure 2:
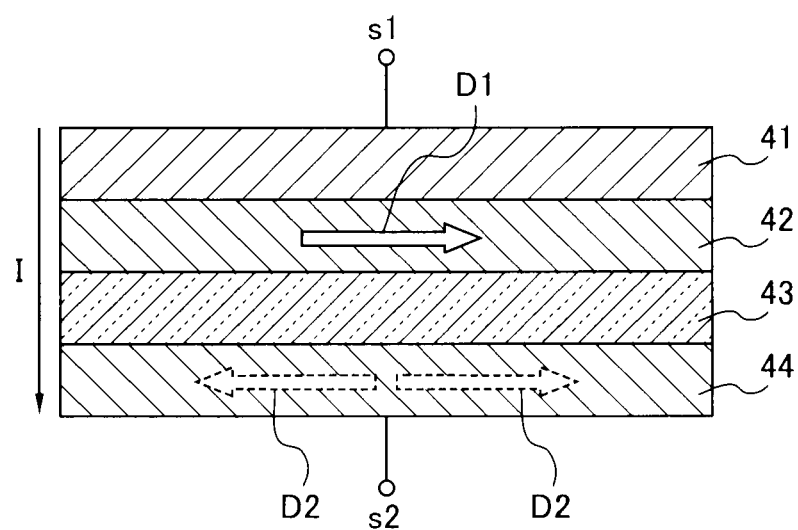
FIG. 2 is a sectional view of a TMR element.

As shown in FIG. 2, the TMR elements 11 to 14, 21 to 24 have a structure in which an anti-ferromagnetic layer 41, a pinned layer 42, an insulating layer 43, and a free layer 44 are stacked in the named order. As is well known, while the free layer 44 is allowed to change a magnetization direction D2 in accordance with an external magnetic field, the pinned layer 42 has a fixed magnetization direction D1. Arrows attached to the first to fourth TMR elements 11 to 14, 21 to 24 shown in FIG. 1 indicate the magnetization direction D1 of the pinned layer 42. Moreover, the insulating layer 43 is the above-mentioned tunnel barrier.

In the first bridge circuit 1, the first and fourth TMR elements 11, 14 and the second and third TMR elements 12, 13 in an opposite relationship are respectively identical in the magnetization direction of the pinned layer 42. Then, the magnetization direction of the pinned layer 42 in the first and fourth TMR elements 11, 14 and the magnetization direction of the pinned layer 42 in the second and third TMR elements 12, 13 are in an anti-parallel (opposite) relationship with each other.

In the second bridge circuit 2, on the other hand, the first and fourth TMR elements 21, 24 and the second and third TMR elements 22, 23 in an opposite relationship are also respectively identical in the magnetization direction of the pinned layer 42. Then, the magnetization direction of the pinned layer 42 in the first and fourth TMR elements 21, 24 and the magnetization direction of the pinned layer 42 in the second and third TMR elements 22, 23 are in an anti-parallel relationship with each other.

As indicated by the arrows in FIG. 1, the individual TMR elements 11 to 14 of the first bridge circuit 1 and the individual TMR elements 21 to 24 of the second bridge circuit 2 are in a perpendicular relationship with each other regarding the magnetization direction of the pinned layer 42.

As is well known, the TMR elements 11 to 14, 21 to 24 are characterized in that the resistance is minimized when the magnetization direction of the pinned layer 42 is identical to the magnetization direction of the free layer 44 but maximized when they are anti-parallel (opposite). Based on this, next will be described a change in resistance of the TMR elements 11 to 14, 21 to 24 with respect to an angle θ of an external magnetic field H shown in FIG. 1. Here, the angle θ is defined such that it indicates 0 degree when the direction of the external magnetic field H is identical to the magnetization direction of the pinned layer 42 in the first and fourth TMR elements 11, 14.

First of all, when the angle θ is 0 degree, the resistance of the first and fourth TMR elements 11, 14 is minimized and the resistance of the second and third TMR elements 12, 13 is maximized in the first bridge circuit 1. In the second bridge circuit 2, on the other hand, the resistance of the individual TMR elements 21 to 24 has a value intermediate between the above maximum and minimum.

Then, when the angle θ is 90 degrees, i.e., when the direction of the external magnetic field H is identical to the magnetization direction of the pinned layer 42 in the TMR elements 22, 23, the resistance of the individual TMR elements 11 to 14 has a value intermediate between the above maximum and minimum in the first bridge circuit 1. In the second bridge circuit 2, on the other hand, the resistance of the first and fourth TMR elements 21, 24 is maximized and the resistance of the second and third TMR elements 22, 23 is minimized.

Then, when the angle θ is 180 degrees, the resistance of the first and fourth TMR elements 11, 14 is maximized and the resistance of the second and third TMR elements 12, 13 is minimized in the first bridge circuit 1. In the second bridge circuit 2, on the other hand, the resistance of the individual TMR elements 21 to 24 has a value intermediate between the above maximum and minimum.

Finally, when the angle θ is 270 degrees, the resistance of the individual TMR elements 11 to 14 has a value intermediate between the above maximum and minimum in the first bridge circuit 1. In the second bridge circuit 2, on the other hand, the resistance of the first and fourth TMR elements 21, 24 is minimized and the resistance of the second and third TMR elements 22, 23 is maximized.

Figure 3:
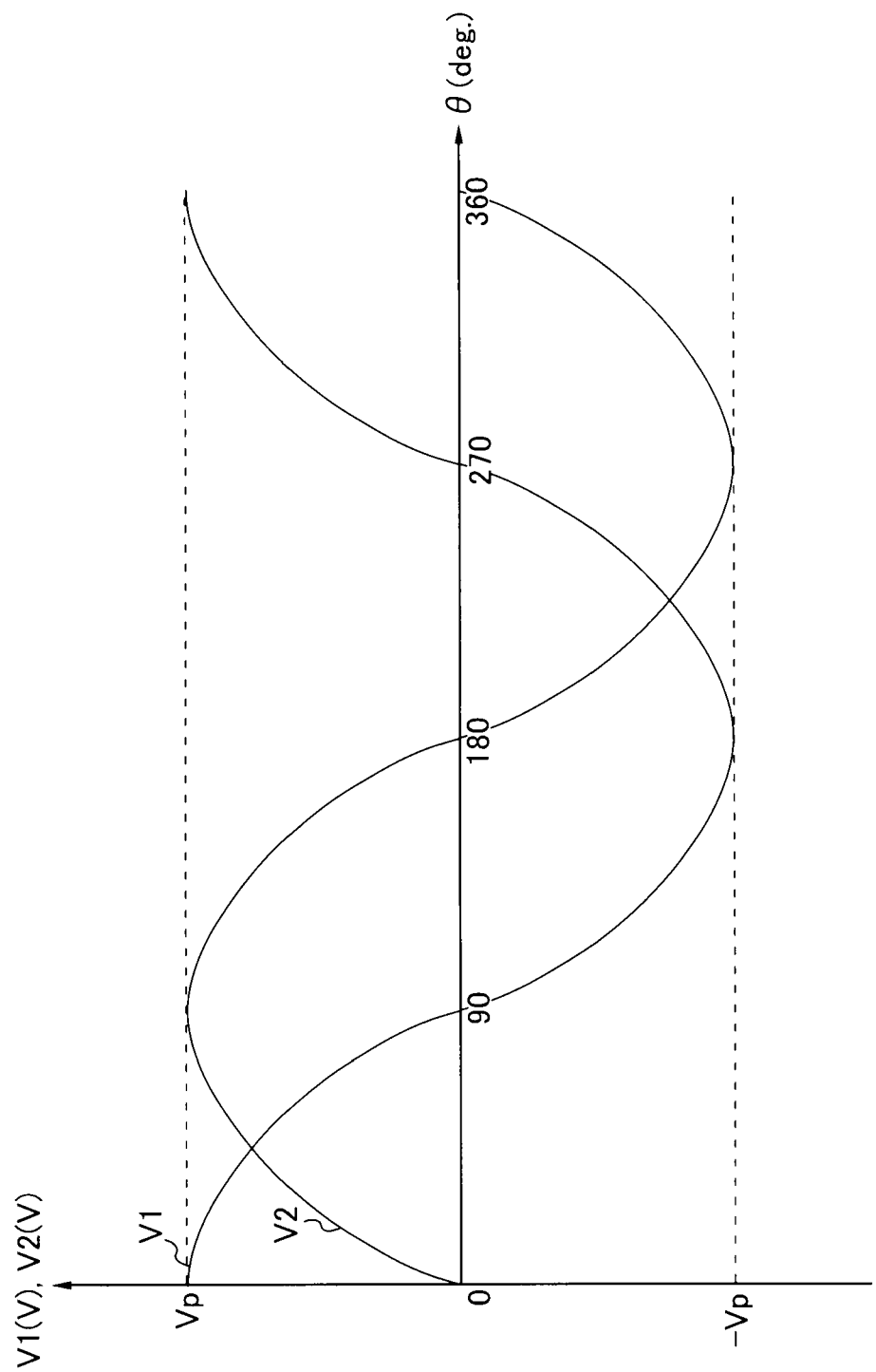
FIG. 3 is a graph showing a change in output voltage with respect to an external magnetic field.

Therefore, as shown in FIG. 3, the output voltage V1(V) of the first bridge circuit 1 has a wave form similar to a COS function with respect to a change of the angle θ, whereas the output voltage V2(V) of the second bridge circuit 2 has a wave form similar to a SIN function with respect to a change of the angle θ. Here, all the TMR elements 11 to 14, 21 to 24 have the same characteristics.

Based on the above facts, the angle θ to be detected can be obtained from the output voltages V1(V), V2(V) according to the following equation:

$$\theta = \arctan(V2/V1).$$

Accordingly, the rotation angle sensor can detect a rotation angle of a measurement target by detecting the external magnetic field H with the TMR elements 11 to 14, 21 to 24.

Figure 4:
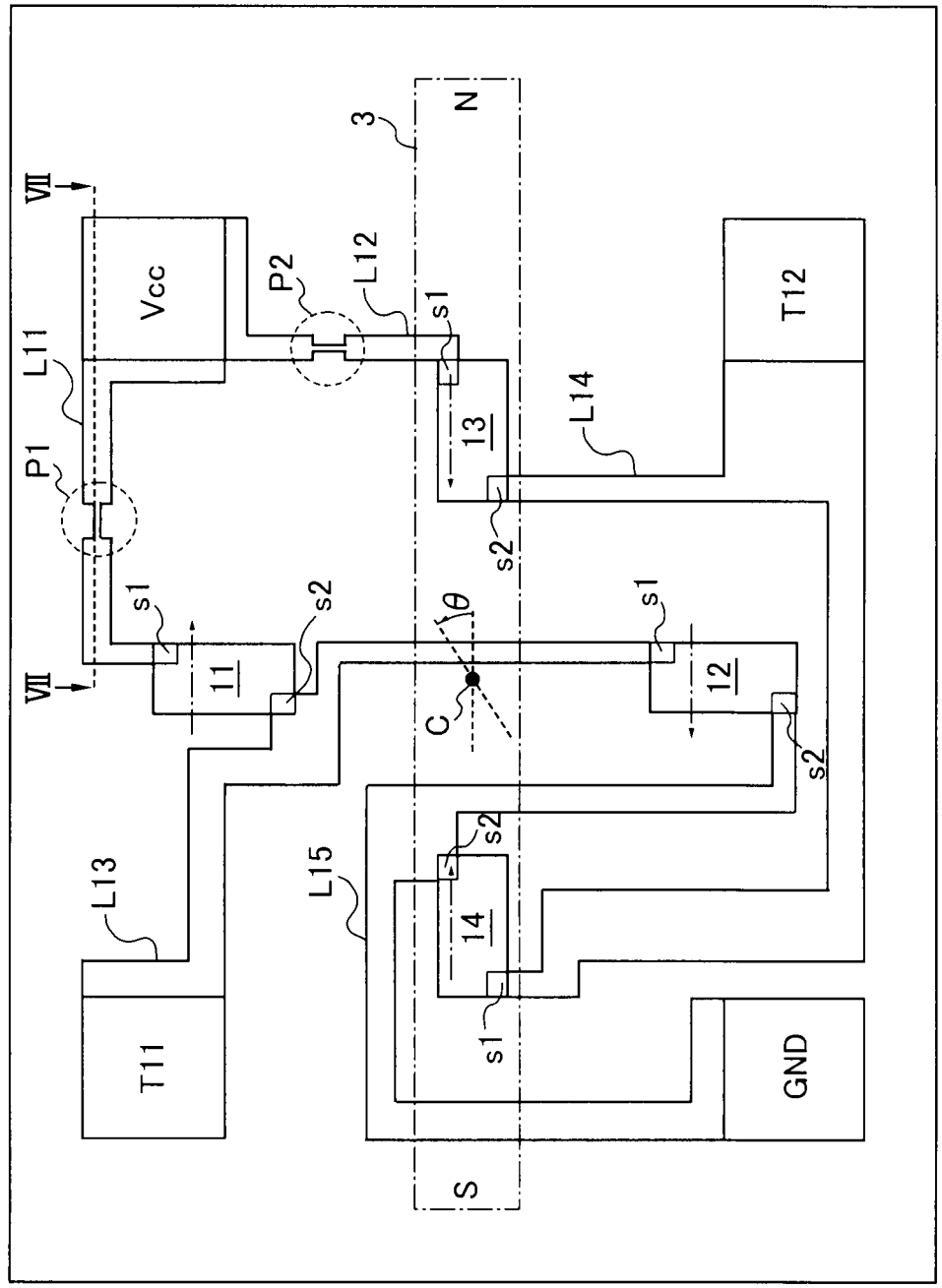
FIG. 4 is a pattern of an electronic circuit board according to the present invention.

Next will be described an electronic circuit board according to the present invention which is to be used for such a magnetic sensor. FIG. 4 is a pattern of the electronic circuit board according to the present invention.

FIG. 4 shows only a pattern of the foregoing first bridge circuit 1, while a pattern of the second bridge circuit 2 is omitted because of its similarity to it. Also in FIG. 4, individual components constituting the pattern are depicted in the plan view as if they are formed on one and the same layer of the electronic circuit board, for convenience of explanation, but it goes without saying that they can be formed over a plurality of layers.

The electronic circuit board includes the TMR elements 11 to 14, leads L11 to L15, the power supply terminal Vcc, the grounding terminal GND, and the output terminals T11, T12.

The individual TMR elements 11 to 14 include two terminals s1, s2, the input terminal s1 being disposed on the side of the anti-ferromagnetic layer 41, the output terminal s2 being disposed on the side of the free layer 44, as shown in FIG. 2. Therefore, a current I flowing through the individual TMR elements 11 to 14 is directed from the anti-ferromagnetic layer 41 to the free layer 44.

Moreover, the individual TMR elements 11 to 14 are arranged in a cross shape as a whole such that their one ends are opposed to each other in each pair with center at a point indicated by the sign C in FIG. 4. In order to detect the angle θ accurately, the electronic circuit board is disposed with the center point C coinciding with a neutral point of a measurement target 3 being a ferromagnetic body as seen in the plan view.

The individual leads L11 to L15 are formed of a conductive metal film such as aluminum, copper, gold, or the like with the periphery covered with an insulating protective film. However, it is also possible to use a metal wire as the individual leads L11 to L15.

The power supply terminal Vcc and the grounding terminal GND are connected to a power supply, i.e., an external power supply unit. However, it is also possible to mount a small power supply unit on the electronic circuit board itself, and in this case, the power supply terminal Vcc and the grounding terminal GND correspond to terminals of such a power supply unit.

The individual output terminals T11, T12 are connected to an arithmetic circuit for calculating the above angle θ. It should be noted that depending on the design, the individual output terminals T11, T12, the power supply terminal Vcc, and the grounding terminal GND may take any suitable form such as electrode pad, connector, through-hole, or the like.

Referring the pattern shown in FIG. 4, the two terminals s1, s2 of the TMR elements 11 to 14 are connected to the power supply and the ground, respectively, at least through the leads L11 to L15.

More specifically, the first TMR element 11 is connected to the power supply terminal Vcc through the lead L11, while the third TMR element 13 is connected to the power supply terminal Vcc through the lead L12. On the other hand, the second and fourth TMR elements 12, 14 are connected to the grounding terminal GND through the lead L15.

Furthermore, the first and second TMR elements 11, 12 are connected to the first output terminal T11 through the lead L13, while the third and fourth TMR elements 13, 14 are connected to the second output terminal T12 through the lead L14.

The circuit board according to the present invention is characterized in that at least a part of the above lead L11 to L15 breaks by an overcurrent due to a short circuit between the two terminals s1, s2. In particular, the leads L11, L12 include areas P1, P2 having a smaller width than the other area and are allowed to be broken, i.e., blown by melting of the areas P1, P2.

It should be noted that the area to be blown is not limited to the above embodiment having a smaller width, but may be embodied to have a smaller thickness than the other area; the area may be embodied in any form as long as it has a smaller cross-sectional area than the other area.

Moreover, the "overcurrent" as used herein refers to a large current which is allowed to flow from the power supply to the ground when the resistance of the insulating layer 43 shown in FIG. 2 is decreased by aged deterioration or the like, leading to a substantial breakdown, i.e., breakdown of the tunnel barrier film and then causing a substantial short circuit between the two terminals s1, s2.

The overcurrent can be generated if the breakdown occurs in any one of the TMR elements 11 to 14. This is because a voltage larger than the rating can be applied to the rest of the TMR elements 11 to 14 connected in series to the broken one of the TMR elements 11 to 14, so that the breakdown also occurs in the rest of the TMR elements 11 to 14.

Because of having a smaller width, the above areas P1, P2 have a higher resistance and are allowed to generate a high heat and melt when subjected to the overcurrent. With this, accordingly, the overcurrent can be shut off.

Figure 5:
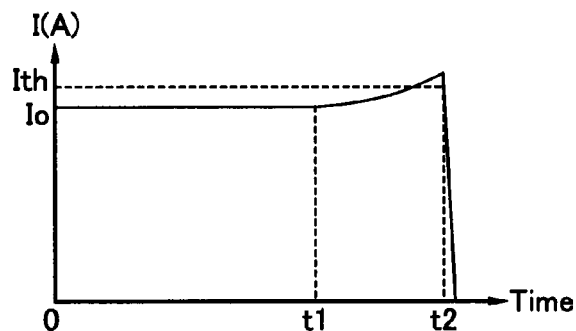
FIG. 5 is a time-current graph showing how an overcurrent is shut off.

FIG. 5 is a time-current graph showing how the overcurrent can be shut off. The current I flowing through the individual TMR element 11 to 14 starts to increase from a steady-state value Io at the time t1 when a failure occurs and then exceeds a threshold value Ith at the time t2, reaching 0 with the above areas P1, P2 being melted.

Figure 6:
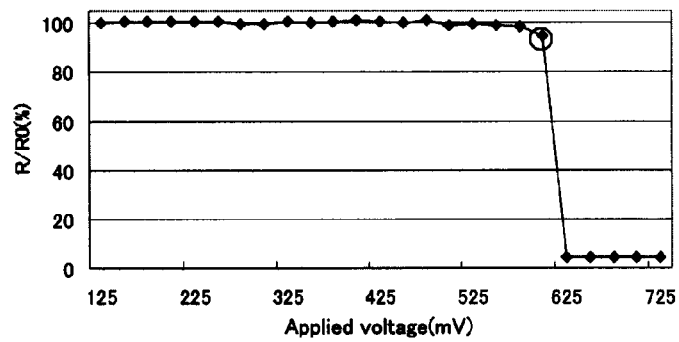
FIG. 6 is a graph showing a resistance change of a TMR element with respect to an applied voltage.

On the other hand, FIG. 6 is a graph showing a resistance change of the TMR element with respect to an applied voltage. R/R0(%) in ordinate represents a percentage of an actual resistance R to an initial resistance R0 of the TMR element. According to the inventors' experiment, it has been found that when the resistance ratio R/R0 is decreased to 95(%) or less by an applied stress such as spike voltage (see the mark ○ in the figure), the TMR element can be considered as being broken.

Accordingly, if it is assumed that the resistance of the TMR element is 100(Ω) and the steady-state value Io of the current is 0.1 (mA), the TMR element can be considered as being broken when the resistance is decreased to 95(Ω), so that the above threshold value Ith should be set at 0.105 (mA). That is, the threshold value Ith which can be considered as an overcurrent may be defined as a current which is allowed to flow when the resistance of the TMR element becomes 95%.

However, as described above, the TMR element is characterized in that the magnetization direction of the free layer changes in accordance with the direction θ of the external magnetic field H, whereby the resistance changes.

It has been found that the condition of the resistance ratio $R/R0 \leq 95(\%)$ is basically common regardless of the direction θ of the external magnetic field H or the presence of the external magnetic field H. However, if the threshold value Ith is set as a current value merely satisfying the resistance ratio R/R0≦95(%), the above fluctuation range can cause a problem. That is, if the initial resistance R0 is set at a maximum of an allowed value range in accordance with the direction of the external magnetic field H or a value close to it, the resistance ratio R/R0≦95(%) can be satisfied when the resistance R becomes a minimum of an allowed value range in accordance with the direction θ of the external magnetic field H, so that even though the TMR element is not faulty, the above areas P1, P2 can be accidentally broken.

In order to avoid this, the threshold value Ith may be defined such that the initial resistance R0 is a minimum of an allowed value range in accordance with the direction of the external magnetic field H. That is, if the reference value is an initial resistance R0 measured when the magnetization direction of the pinned layer and the magnetization direction of the free layer are anti-parallel to each other, a margin can be allowed for the above fluctuation range of the resistance regarding the resistance ratio R/R0, so that the areas P1, P2 will never be accidentally broken.

However, the threshold value Ith may also be defined regardless of the resistance ratio R/R0. That is, the threshold value Ith may be defined as being 105(%) of a current value To which is allowed to flow when the resistance R becomes a minimum of an allowed value range in accordance with the direction θ of the external magnetic field H.

Thus, the width of the above areas P1, P2 should be properly determined based on the threshold value Ith, the material of the leads L11, L12, and so on.

In the electronic circuit board according to the present invention, since the two terminals s1, s2 of the TMR element 11 to 14 are connected between the power supply and the ground at least through the lead L11 to L15, if the two terminals s1, s2 are short-circuited by a failure of the TMR element 11 to 14, the power supply and the ground can be short-circuited to generate an overcurrent.

In the electronic circuit board according to the present invention, therefore, at least a part L11, L12 of the lead L11 to L15 is designed to break due to the overcurrent, thereby shutting off the overcurrent to protect the power supply. In addition, since the overcurrent can be shut off only by the break of the lead L11, L12, a complicated control means is not required, making it easy to achieve miniaturization and cost-reduction of the electronic circuit board.

Thus, the electronic circuit board according to the present invention is capable of effectively preventing a short circuit accident which may be caused by a failure of the TMR element.

In the foregoing embodiment, only the leads L11, L12 extending from the TMR elements 11, 13 to the power supply terminal Vcc are designed to break due to the overcurrent, but this is not the only embodiment and in addition to this, or alternatively, the lead L15 extending from the TMR elements 12, 14 to the grounding terminal GND may be designed to break at any part between the TMR element 14 and the grounding terminal GND. Alternatively, the lead L13 may be designed to break at any part between the TMR element 11 and the TMR element 12, while the lead L14 may be designed to break at any part between the TMR element 13 and the TMR element 14.

That is, any part of the leads L11 to L15 may be selected as long as they can completely interrupt the overcurrent flowing from the power supply terminal Vcc to the grounding terminal GND.

Here, if a grounding layer is provided adjacent to a layer on which the leads L11, L12 are arranged in order to stabilize electrical characteristics, the areas P1, P2 to be broken are preferably provided in the leads L11, L12 extending from the TMR elements 11, 13 to the power supply terminal GND, as in the present embodiment.

Figure 7:
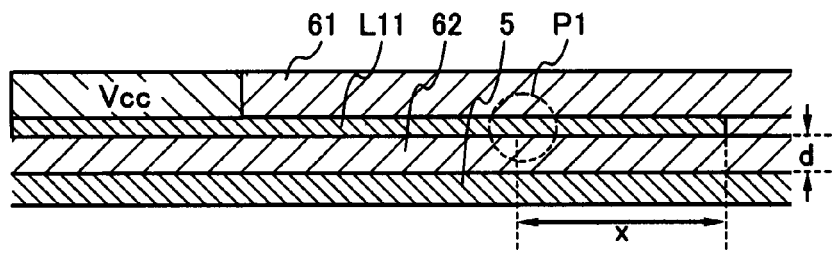
FIG. 7 is a sectional view taken along line VII-VII in FIG. 4.

In this regard, for example, FIG. 7 is a sectional view taken along line VII-VII in FIG. 4. Here, the lead L11 is vertically sandwiched between insulating protective layers 61, 62 with a grounding layer 5 being disposed adjacent to a lower side of the lower protective layer 62.

Since the grounding layer 5 is electrically connected to the grounding terminal GND through a through-hole or the like, if it is provided all over or at least partly over the surface of the electronic circuit board, for example, in such a manner as to overlap with the leads L11 to L15 as seen in the plan view, it can serve as an electromagnetic shield.

By employing the illustrated layer structure, noise immunity can be improved to electrically stabilize the whole circuit, but, on the other hand, if the lower protective layer 62 is deteriorated to cause a breakdown, a short circuit may occur between the power supply and the ground. In order to avoid this breakdown, the protective layer 62 may have a large thickness d, which is, however, undesirable from the viewpoint of miniaturization of the product because it increases the thickness of the whole electronic circuit board.

Therefore, the area P1 to be broken is provided in the lead L11, whereby even if the protective layer 62 has a breakdown within the range indicated by x in the figure, the short circuit between the power supply and the ground can be avoided by blowing of the area P1. Here, the larger the range x, the better, so that the area P1 is preferably located as closer as possible to the power supply terminal Vcc taking into consideration variation in printing position during production of the board. It can easily be understood that this embodiment also applies to the area P2.

In the foregoing embodiment, the areas P1, P2 to be broken are illustrated as the one which is formed by partially narrowing the lead L11, L12, but they are not limited thereto.

Figure 8:
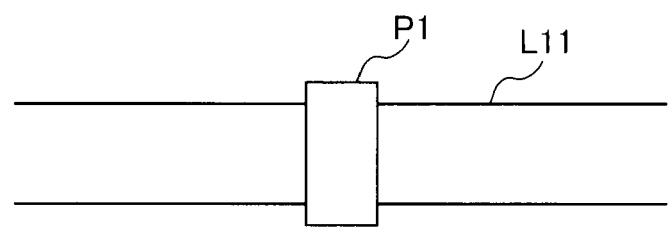
FIG. 8 is a partial pattern according to a modification of an electronic circuit board according to the present invention.

For example, FIG. 8 is a plan view showing an area P1 according to a modification of the present invention. In this embodiment, the area P1 of the lead L11 is made of a material different from that of the other area. The material of the area P1 has a lower melting point than that of the other area and can easily be blown by the foregoing overcurrent. Such a material may be indium or gallium, for example. Here, a fuse may be provided instead at the area P1, which is, however, not quite desirable from the viewpoint of cost-reduction and miniaturization because it may increase the component count and the footprint.

Figure 9:
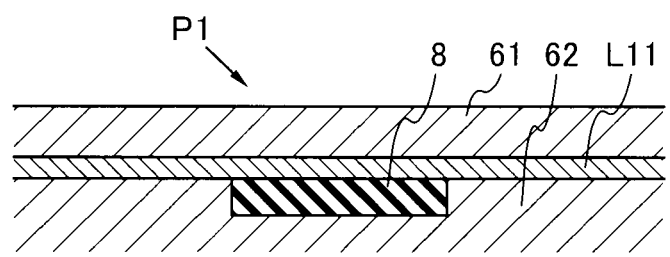
FIG. 9 is a partial sectional view according to a modification of an electronic circuit board according to the present invention.

On the other hand, FIG. 9 is a sectional view as seen horizontally likewise in FIG. 7 and showing an area P1 according to another modification of the present invention. In this embodiment, a vaporizable material 8 is provided beneath the area P1 to be broken, so that the vaporizable material 8 can be sublimed by heat due to the foregoing overcurrent to generate a gas and the area P1 can be broken by the gas pressure. The gas pressure is preferably strong enough to burst the area P1 together with the upper protective film 61 so as to ensure the break. As the vaporizable material 8 capable of generating such a gas pressure, for example, there can be used a polymer material.

Figure 10:
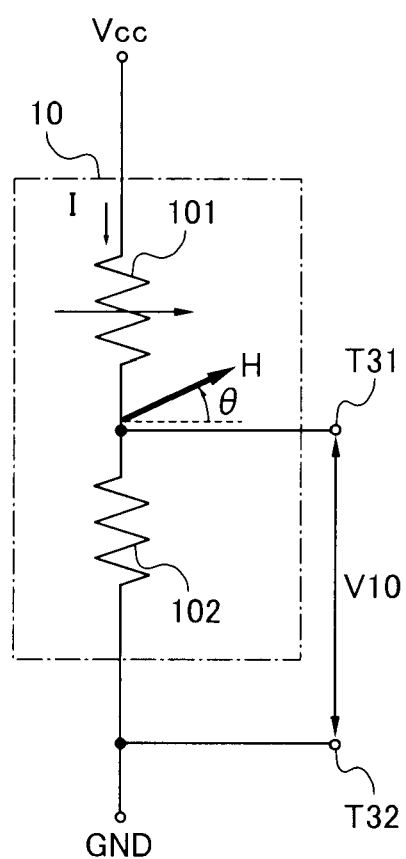
FIG. 10 is a circuit diagram of a magnetic sensor according to another embodiment.

The foregoing description has been made with reference to the full-bridge circuit shown in FIG. 1, but circuits that can be used for a rotation angle sensor are not limited thereto. FIG. 10 is a circuit diagram of a magnetic sensor formed by using a half-bridge circuit.

In this embodiment, the magnetic sensor circuit has a bridge circuit 10. The bridge circuit 10 includes a TMR element 101 and a resistance element 102 which are connected in series to each other. Two ends of the series circuit are connected to the power supply Vcc and the grounding terminal GND, respectively. Furthermore, the connected ends of the TMR element 101 and the resistance element 102 are connected to a first output terminal T31, wherein the electric potential of the first output terminal T31 with respect to the electric potential of a terminal T32 connected to the grounding terminal GND can be detected as an output voltage V10.

Here, it should be noted that the resistance element 102 is not a TMR element but an ordinary resistance element. However, it goes without saying that the resistance element 102 may be replaced by a TMR element.

The output voltage V10 changes in accordance with the direction 6 of the external magnetic field H to be detected, as in FIG. 3 illustrated above. Thus, SIN and COS components of the magnetic field H can be detected by using this circuit in the same manner as in the foregoing embodiment, and the angle θ can be calculated according to a given equation.

Figure 11:
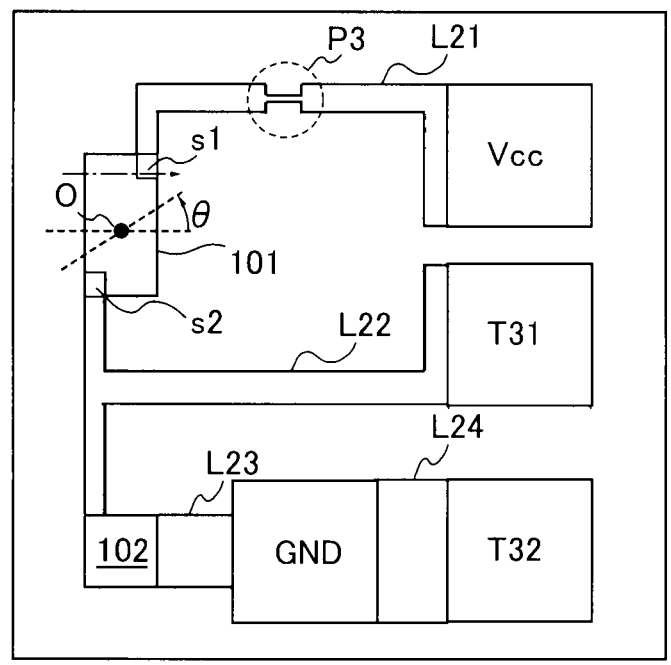
FIG. 11 is a pattern of an electronic circuit board according to the embodiment shown in FIG. 10.

FIG. 11 is a pattern of an electronic circuit board according to the present embodiment. Description of the items common to the embodiment shown in FIG. 5 will be omitted below.

The electronic circuit board includes the TMR element 101, the resistance element 102, leads L21 to L24, the power supply terminal Vcc, the grounding terminal GND, and the output terminals T31, T32. In order to detect the angle θ accurately, the electronic circuit board is disposed with a center O of the TMR element 101 coinciding with a neutral point of the measurement target 3 (not shown).

Referring to the illustrated pattern, at first, the TMR element 101 is connected to the power supply terminal Vcc through the lead L21. This lead L21 has an area P3 which can break due to an overcurrent in the same manner as the areas P1, P2 in the foregoing embodiment.

The TMR element 101 is also connected to the resistance element 102 and the output terminal T31 through the lead L22. Moreover, the resistance element 102 and the grounding terminal GND are connected to each other through the lead L23, whereas the grounding terminal GND and the output terminal T32 are connected to each other through the lead L24.

The present embodiment makes it possible not only to protect the power supply from an overcurrent by using the area P3 as in the foregoing embodiment but also to reduce the number of TMR elements to be used for the magnetic sensor circuit, providing both benefits of cost-reduction and miniaturization.

Next will be described a method for protecting a power supply according to the present invention. The power supply protecting method according to the present invention is a method for protecting a power supply of an electronic circuit including a TMR element having two terminals connected to a power supply and a ground, respectively, at least through a lead, comprising breaking at least a part of the lead with an overcurrent due to a short circuit between two terminals caused by a breakdown of a tunnel barrier film of the TMR element, as described above. Here, the overcurrent can be defined as a current allowed to flow when a resistance of the TMR element becomes equal to or less than 95% of a minimum of an allowed value range in accordance with a direction of an external magnetic field.

Thus, since the power supply protecting method according to the present invention has substantially the same feature as the foregoing electronic circuit board, it also has the same effect as above.

Hereinabove, as a typical example of the application of the electronic circuit board and the power supply protecting method according to the present invention, the description has been made with reference to the magnetic sensor, but according to the technical idea of the present invention, it can easily be understood that they are also applicable to other devices or apparatuses having a similar circuit configuration. Hence, it goes without saying that a MRAM (magneto-resistive random access memory) and a magnetic head of a hard disk drive also using the TMR element are within the applicable range of the present invention.

The present invention has been described in detail above with reference to preferred embodiments. However, obviously those skilled in the art could easily devise various modifications of the invention based on the technical concepts underlying the invention and teachings disclosed herein.

What is claimed is:

1. An electronic circuit board comprising a TMR element having two terminals connected to a power supply and a ground, respectively, at least through a lead, wherein
   the lead has at least an area which breaks by an overcurrent due to a short circuit between the two terminals after a breakdown of a tunnel barrier film of the TMR element,
   the electronic circuit board comprises a protective layer and a grounding layer, the protective layer being an insulating layer, the grounding layer being electrically connected to the ground and provided on one side of the protective layer,
   the lead is provided on another side opposite the one side of the protective layer and opposed to the grounding layer; and
   the area is provided in a portion of the lead which directly connects the TMR element with a positive terminal of the power supply.

2. The electronic circuit board of claim 1, wherein the overcurrent is a current allowed to flow when a resistance of the TMR element becomes equal to or less than 95% of a minimum of an allowed value range in accordance with a direction of an external magnetic field.

3. The electronic circuit board of claim 1, wherein a part of the lead includes a second area having a smaller cross-section than the area and is allowed to be broken by melting of the second area.

4. The electronic circuit board of claim 1, wherein a part of the lead includes a second area having a lower melting point than the area and is allowed to be broken by melting of the second area.

5. A magnetic sensor comprising the electronic circuit board of claim 1 that detects an external magnetic field with the TMR element.

6. A method for protecting a power supply of an electronic circuit including a TMR element having two terminals connected to a power supply and a ground, respectively, at least through a lead, comprising
   breaking at least an area of the lead with an overcurrent due to a short circuit between the two terminals caused by a breakdown of a tunnel barrier film of the TMR element, wherein
   the area is provided in a portion of the lead which directly connects the TMR element with a positive terminal of the power supply,
   the electronic circuit includes a protective layer and a grounding layer,
   the protective layer is an insulating layer,
   the grounding layer is electrically connected to the ground and provided on one side of the protective layer, and the lead is provided to another side opposite to the one side of the protective layer and opposed to the grounding layer.

7. The method of claim 6, wherein the overcurrent is a current allowed to flow when a resistance of the TMR element becomes equal to or less than 95% of a minimum of an allowed value range in accordance with a direction of an external magnetic field.

* * * * *